United States Patent
Djemour et al.

(10) Patent No.: US 10,497,587 B1
(45) Date of Patent: Dec. 3, 2019

(54) ION MANIPULATION METHODS AND RELATED APPARATUSES AND SYSTEMS FOR SEMICONDUCTOR ENCAPSULATION MATERIALS

(71) Applicant: Infineon Technologies AG, Neubiberg (DE)

(72) Inventors: Rabie Djemour, Munich (DE); Michael Bauer, Nittendorf (DE); Stefan Miethaner, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/007,038

(22) Filed: Jun. 13, 2018

(51) Int. Cl.
 *H01L 21/00* (2006.01)
 *H01L 21/56* (2006.01)
 *H01L 23/29* (2006.01)
 *H01L 21/67* (2006.01)

(52) U.S. Cl.
 CPC .......... *H01L 21/561* (2013.01); *H01L 21/565* (2013.01); *H01L 21/67126* (2013.01); *H01L 23/29* (2013.01)

(58) Field of Classification Search
 CPC ............. H01L 23/3171; H01L 23/3107; H01L 23/3185; H01L 21/2253; H01L 23/293; H01L 2031/0344; H01L 2924/181
 USPC .......................................... 438/127; 257/787
 See application file for complete search history.

(56) References Cited

U.S. PATENT DOCUMENTS

| | | | | |
|---|---|---|---|---|
| 3,939,488 A | * | 2/1976 | Wakashima | H01L 23/3135 257/786 |
| 2006/0055064 A1 | * | 3/2006 | Kaneko | H01L 23/3135 257/787 |
| 2012/0205821 A1 | * | 8/2012 | Tan | H01L 23/26 257/787 |
| 2014/0091483 A1 | * | 4/2014 | Akiba | H01L 21/561 257/787 |
| 2014/0264956 A1 | * | 9/2014 | Shiobara | H01L 21/78 257/787 |
| 2014/0329363 A1 | * | 11/2014 | Sekiguchi | H01L 21/561 438/127 |
| 2017/0226652 A1 | * | 8/2017 | Pillow | C25D 13/02 |

* cited by examiner

*Primary Examiner* — S. V. Clark
(74) *Attorney, Agent, or Firm* — Murphy, Bilak & Homiller, PLLC

(57) ABSTRACT

A method for manipulating ions contained in an encapsulation material for a semiconductor device is provided. The method includes processing the encapsulation material and applying an electric field to the encapsulation material before the encapsulation material is finally cured. The ions contained in the encapsulation material have a mobility that decreases as the encapsulation material cures. By applying the electric field to the encapsulation material before the encapsulation material is finally cured, the amount of ions contained in the encapsulation material is reduced and/or the ions contained are concentrated in one or more regions of the encapsulation material. Corresponding apparatuses and semiconductor packages manufactured by the method are also described.

19 Claims, 14 Drawing Sheets

ION MANIPULATION METHODS AND RELATED APPARATUSES AND SYSTEMS FOR SEMICONDUCTOR ENCAPSULATION MATERIALS

BACKGROUND

Mobile ions or charges in die encapsulation materials such as mold compounds may reduce the reliability of encapsulated semiconductor packages. This problem worsens for products which must to withstand high operating voltages and/or are subject to extreme operating conditions such as high temperatures above 150° C. The likelihood of ion migration into critical areas of the package over the lifetime of an encapsulated semiconductor package increases for higher operating temperatures and voltages. Excessive ion migration may adversely affect the electrical parameters and functionality of the encapsulated semiconductor package. Hence, improved techniques for limiting ion migration within encapsulated semiconductor packages are needed.

SUMMARY

According to an embodiment of a method, the method comprises: processing an encapsulation material for a semiconductor device, the encapsulation material containing ions which have a mobility that decreases as the encapsulation material cures; and applying an electric field to the encapsulation material before the encapsulation material is finally cured, to reduce the amount of ions contained in the encapsulation material and/or to concentrate the ions contained in the encapsulation material in one or more regions of the encapsulation material.

According to an embodiment of a semiconductor package, the semiconductor package comprises: a semiconductor die; an encapsulation material contacting the semiconductor die; and a first group of ions concentrated in the encapsulation material at a first distance from the semiconductor die.

According to an embodiment of an apparatus, the apparatus comprises: an enclosure configured to receive an encapsulation material for a semiconductor device, the encapsulation material containing ions which have a mobility that decreases as the encapsulation material cures; at least one pair of electrodes configured to apply an electric field to the encapsulation material received by the enclosure before the encapsulation material is finally cured, to reduce the amount of ions contained in the encapsulation material and/or to concentrate the ions contained in the encapsulation material in one or more regions of the encapsulation material; and a power source configured to provide a voltage across the at least one pair of electrodes.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description which follows.

DETAILED DESCRIPTION

Embodiments described herein provide methods and related apparatuses and systems for manipulating ions contained in encapsulation materials for semiconductor devices. Ions may be formed in and/or added to an encapsulation material as part of the material manufacturing process, may be present at the surface of a semiconductor device to be at least partly covered by an encapsulation material, may be introduced during the encapsulation process. Mobile sodium is particularly problematic, and typically found in common mold compounds where the source may be e.g. aluminum hydroxide (flame retardant). Other types of mobile ions present in a semiconductor device encapsulation material may also affect electrical parameters and functionality of the semiconductor device at least partly covered by the encapsulation material.

By applying an electric field to the encapsulation material before the encapsulation material is finally cured, the amount of ions contained in the encapsulation material may be reduced and/or the ions contained in the encapsulation material may be concentrated in one or more less critical regions of the encapsulation material which have less effect on electrical parameters and functionality of a semiconductor device at least partly covered by the encapsulation material.

Ions contained within encapsulation materials for semiconductor devices typically have a mobility that decreases with curing. Hence, the methods, apparatuses and systems described herein may be used during manufacture of an encapsulation material, during application of an encapsulation material to a semiconductor device, and/or during curing of an encapsulation material.

Figure 1:
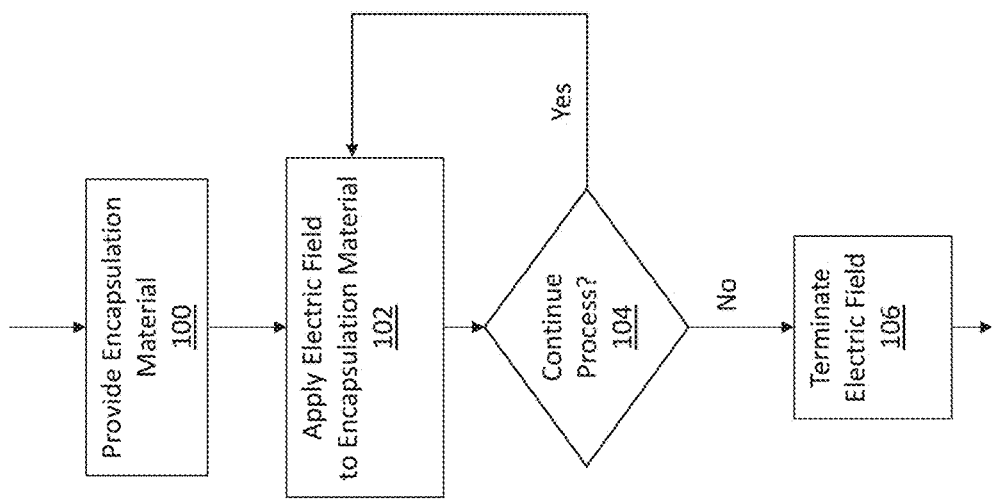
FIG. 1 illustrates an embodiment of a method for manipulating ions contained in an encapsulation material for a semiconductor device.

FIG. 1 illustrates an embodiment of a method for manipulating ions contained in an encapsulation material for a semiconductor device. The encapsulation material contains ions which have a mobility that decreases as the encapsulation material cures. For example, the encapsulation material may be a mold compound and/or resin used in injection molding, compression molding, film-assisted molding (FAM), reaction injection molding (RIM), resin transfer molding (RTM), blow molding, etc. Common mold compounds and resins include, but are not limited to, thermoset resins, gel elastomers, encapsulants, potting compounds, composites, optical grade materials, etc. Mold compounds are typically supplied as pellets, films, liquids and/or powders. Other types of encapsulation materials for semiconductor devices and which contain ions having a mobility that decreases as the encapsulation material cures may include, but are not limited to any standard insulative PCB (printed circuit board) material with or without glass fibers, polymer films or stacks of polymer films, any standard insulative eWLB (embedded wafer level ball grid array) material, etc.

The method illustrated in FIG. 1 includes processing the encapsulation material (Block 100). The type of processing performed on the encapsulation material may depend on the type of material and/or stage of manufacture/use.

For example, in the case of making a mold compound (MC) type encapsulation material, the processing (Block 100) may include forcing a liquified base material used to form the MC encapsulation material through a conduit. The liquified base material may be a resin, and possible fillers and/or additives such as fiberglass reinforcements, flame retardants, hardeners, etc. may be added to the base material.

In the case of applying the encapsulation material to a semiconductor device e.g. by molding, PCB encapsulation, eWLB encapsulation, etc., the processing (Block 100) may include inserting the encapsulation material in a chamber or mold cavity. The chamber or mold cavity includes each semiconductor device to be at least partly covered by the encapsulation material. For molding, the encapsulation material may be liquified and forced into a mold cavity through a conduit. For PCB and eWLB encapsulation, the encapsulation material may be placed in a processing chamber.

After encapsulation, the processing (Block 100) may include curing the encapsulation material in a curing oven.

The method further includes applying an electric field to the encapsulation material before the encapsulation material is finally cured (Block 102). The way in which the electric field is applied may depend on the type of material and/or stage of manufacture/use.

For example, in the case of making the encapsulation material, the electric field may be applied (Block 102) to the liquified base material used to make a MC encapsulation material by applying a voltage across at least one pair of electrodes disposed outside the conduit carrying the liquified base material, disposed inside the conduit or which form part of the conduit. Positive ions such as sodium contained in the liquified base material flowing through the conduit are attracted to each negatively charged electrode, and negative ions contained in the liquified material are attracted to each positively charged electrode. The electrodes may be cleaned periodically, e.g. by flushing the conduit, to prevent ion buildup inside the conduit.

In the case of applying the encapsulation material to a semiconductor device e.g. by molding, the electric field may be applied (Block 102) to a liquified MC encapsulation material as it flows through a conduit and into a mold cavity, by applying a voltage across at least one pair of electrodes disposed outside the conduit, disposed inside the conduit or which form part of the conduit. The electrodes may be cleaned periodically, e.g. by flushing the conduit, to prevent ion buildup inside the conduit. For PCB and eWLB encapsulation, the electric field may be applied (Block 102) to the PCB or eWLB encapsulation material inside a processing chamber by applying a voltage across a first electrode provided by the semiconductor device and a second electrode spaced apart from the semiconductor device in the chamber. In each encapsulation process, positive ions contained in the encapsulation material are attracted to each negatively charged electrode and negative ions contained in the encapsulation material are attracted to each positively charged electrode.

During curing of the encapsulation material, the electric field may be applied (Block 102) to the encapsulation material before the encapsulation material is finally cured by applying a voltage across a first electrode provided by the encapsulated semiconductor device and a second electrode spaced apart from the encapsulated semiconductor device in the curing oven. Positive ions contained in the encapsulation material are attracted to each negatively charged electrode as the encapsulation material cures, and negative ions contained in the curing encapsulation material are attracted to each positively charged electrode. For PCB and eWLB encapsulation, the processing chamber used to apply PCB or eWLB encapsulation material to a semiconductor device may also function as the oven for finally curing the PCB or eWLB encapsulation material. In other embodiments, the curing oven is separate from the processing chamber used for the encapsulation process.

In each of these examples, at least one pair of electrodes is in close enough proximity to the encapsulation material so that positive ions contained in the encapsulation material are attracted to each negatively charged electrode and negative ions contained in the encapsulation material are attracted to each positively charged electrode. By applying the electric field to the encapsulation material before the encapsulation material is finally cured, the amount of ions contained in the encapsulation material is reduced and/or the ions contained in the encapsulation material are concentrated in one or more less critical regions of the encapsulation material which have less effect on electrical parameters and functionality of the semiconductor device at least partly covered by the encapsulation material. The electric field may be applied for a fixed duration of time, or until some condition occurs or criteria is satisfied e.g. molding is complete, final curing is complete, sensor activation, safety interrupt, etc. (Block 104). The electric field applied to the encapsulation material as part of the ion manipulation method may be constant or variable (changing). Application of the electric field to the encapsulation material is terminated at Block 106.

Figure 2:
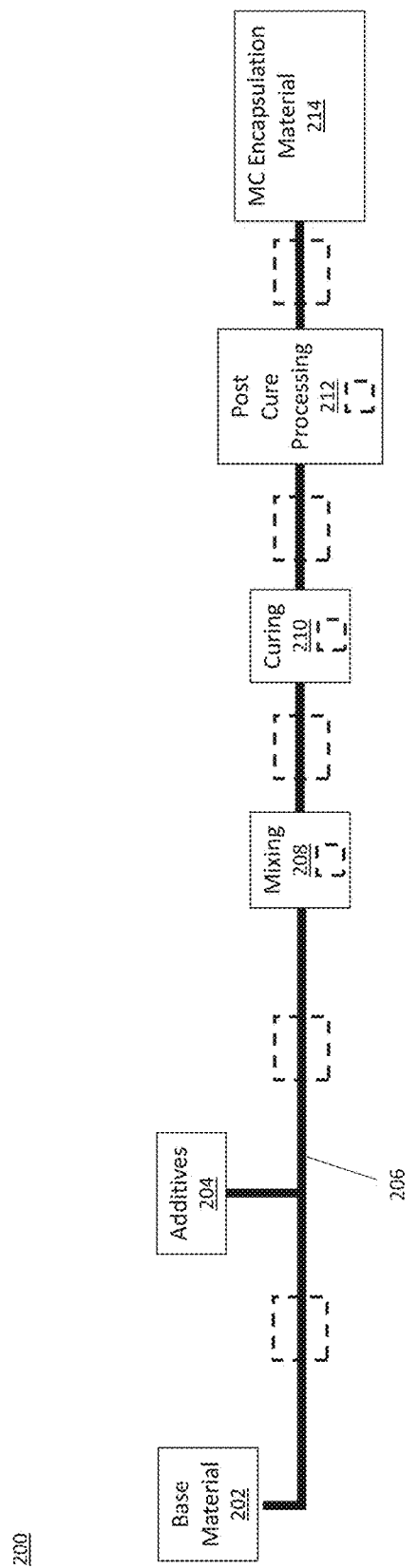
FIG. 2 illustrates a generic block diagram of an embodiment of implementing the ion manipulation method illustrated in FIG. 1 in a system for making a mold compound encapsulation material.

FIG. 2 illustrates a generic block diagram of an embodiment of implementing the ion manipulation method described herein and illustrated in FIG. 1 in a system 200 for making a MC (mold compound) encapsulation material. The system 200 includes a supply 202 for the base material such as a resin, and a supply 204 for possible fillers and/or additives such as fiberglass reinforcements, flame retardants, hardeners, etc. The system 200 includes one or more conduits or lines 206 for carrying the materials to a mixing unit 208 which mixes the base material and possible fillers and/or additives. The materials may be liquified before mixing. The system 200 includes a curing unit 210 for optionally extruding and at least partly curing the mixture output by the mixing unit 208. This stage provides an intermediate curing. Final curing of the encapsulation material occurs after the encapsulation material is applied to a semiconductor device. The system may include one or more post-curing stages 212. The MC encapsulation material 214 is then ready for application to a semiconductor device, e.g. in pellet form, film form, liquid form, powder form, etc. The ion manipulation method described herein and illustrated in FIG. 1 may be used at any stage of the MC encapsulation material manufacturing process illustrated in FIG. 2, where the ions in the material are mobile enough to be moved by an applied electric field. The dashed boxes in FIG. 2 show exemplary stages where the ion manipulation method may be employed.

Figure 3:
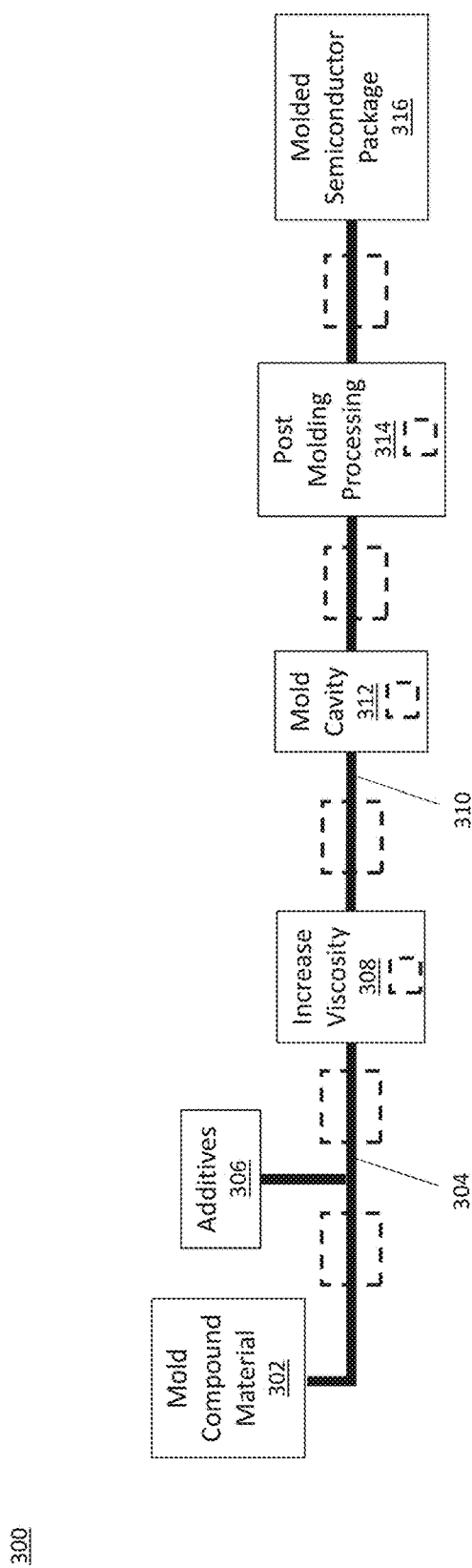
FIG. 3 illustrates a generic block diagram of an embodiment of implementing the ion manipulation method illustrated in FIG. 1 in a system for encapsulating a semiconductor device in a mold compound encapsulation material.

FIG. 3 illustrates a generic block diagram of an embodiment of implementing the ion manipulation method described herein and illustrated in FIG. 1 in a system 300 for encapsulating a semiconductor device in a MC (mold compound) encapsulation material. The system 300 includes a supply 302 for the MC encapsulation material such as a thermoset resin, gel elastomer, encapsulant, potting compound, composite, optical grade material, etc. The system 300 includes one or more conduits or lines 304 for carrying the MC encapsulation material and possible additives such as dies, hardeners, etc. to a viscosity unit 308. The viscosity unit 308 increases the viscosity of the MC encapsulation material and possible additives, e.g., by melting, liquifying, etc. for pressing the MC encapsulation material into cavities. The system 300 includes another conduit or line 310 for carrying the melted MC encapsulation material from the viscosity unit 308 to a mold cavity 312 which contains the semiconductor device to be at least partly covered by the MC encapsulation material. Depending on the type of molding process, the mold cavity 312 may be enclosed or open to a fill plunger. Some intermediate curing may occur in the mold cavity 312 as the MC encapsulation material cools. The system 300 may include one or more post-curing stages 314, such as trimming, thinning, deflashing, scribing, etc. The molded semiconductor package 316 is then ready for final curing. The ion manipulation method described herein and illustrated in FIG. 1 may be used at any stage in the molding process illustrated in FIG. 3, where the ions in the material are mobile enough to be moved by an applied electric field. The dashed boxes in FIG. 3 show exemplary stages where the ion manipulation method may be employed.

FIGS. 4 through 9 illustrate embodiments in which the ion manipulation method is used with an enclosure configured to receive an encapsulation material for a semiconductor device, the encapsulation material containing ions which have a mobility that decreases as the encapsulation material cures. Even if the mobility of one type of ions does not decrease during curing, an electric field could still be used to away another sort of ions from critical areas, improving device reliability. An added layer may be provided to trap ions with a decreasing mobility and/or move ions without a decreasing mobility. The ions contained in the encapsulation material may be ions which naturally occur in the encapsulation material and/or intentionally or unintentionally added ions during manufacturing of the raw material used to make the encapsulation material or the partially manufactured material. In each case, ions on the surface prior to molding can be cleaned by the methods described herein using any layer where a curing/field can be applied. In general, the source of the ions is irrelevant so long as the ions are moveable in an electric field.

According to the embodiment shown in FIGS. 4 through 9, the enclosure is a conduit 400 configured to carry a MC encapsulation material which is indicated by a downward-facing dashed arrow. The conduit 400 may be any type of pipe, tube, line, etc. used to carry the MC encapsulation material prior to final curing. The MC encapsulation material carried by the conduit 400 may be in its final form just prior to application to a semiconductor device, may be in its base material form, or may be in some intermediary form. For example, the conduit 400 may be configured to carry a liquified base material used to form the MC encapsulation material, e.g. as shown in FIG. 2. The conduit 400 may be configured to carry the MC encapsulation material in an uncured state to a chamber or mold cavity, e.g. as shown in FIG. 3. In each case, at least one pair of electrodes 402, 404 is provided for applying an electric field to the MC encapsulation material carried by the conduit 400 before the MC encapsulation material is finally cured.

Figure 4:
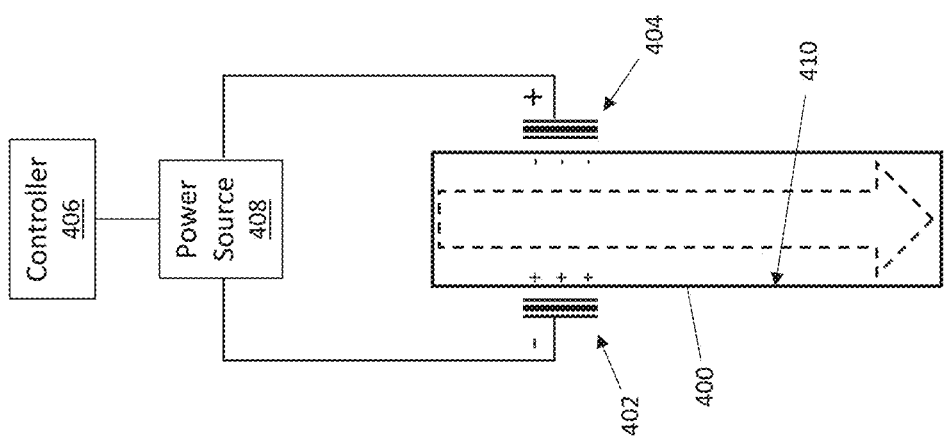

FIG. 4 illustrates an embodiment of the conduit 400 in which the at least one pair of electrodes 402, 404 is disposed outside the conduit 400. An electric field is applied to the MC encapsulation material carried by the conduit 400 via the at least one pair of electrodes 402, 404. A controller 406 may be provided for controlling a power source 408 which applies a voltage across the at least one pair of electrodes 402, 404 disposed outside the conduit 400. The controller 406 and power source 408 may be integrated or separate components. The controller 406 may control the power source 408 so that a constant electric field is applied to the MC encapsulation material via the at least one pair of electrodes 402, 404. In another embodiment, the controller 406 may control the power source 408 so that a changing electric field such as a pulsed electric field, a voltage waveform with continuously increasing field, a voltage waveform with continuously decreasing field, a voltage waveform with alternating amplitudes (even within one polarity), etc. is applied to the MC encapsulation material via the at least one pair of electrodes 402, 404. That is, the electric field may be constant or changing in polarity and/or intensity in any suitable combination.

In each case, the ions contained in the MC encapsulation material are mobile enough to be moved by the applied electric field. Positive ions (+) contained in the MC encapsulation material carried by the conduit 400 are attracted to each negatively charged electrode 402, and negative ions (−) contained in the MC encapsulation material carried by the conduit 400 are attracted to each positively charged electrode 404. The electric field applied to the at least one pair of electrodes 402, 404 disposed outside the conduit 400 holds (traps) the ions along the inner walls 410 of the conduit 400 so that the amount of ions contained in the MC encapsulation material is reduced. The inner walls 410 of the conduit 400 may be cleaned periodically, e.g. by flushing the conduit, to prevent ion buildup along the inner walls.

Figure 5:
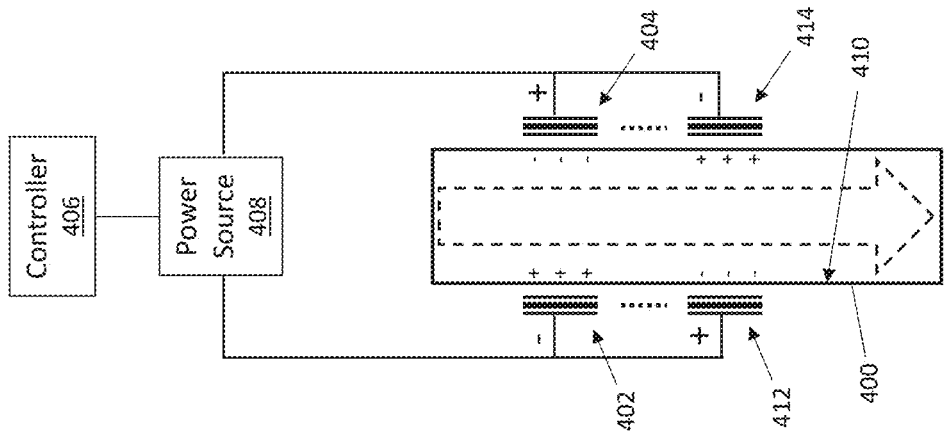
FIGS. 4 through 9 illustrate respective schematic diagrams of embodiments in which the ion manipulation method illustrated in FIG. 1 is used with an enclosure configured to receive an encapsulation material for a semiconductor device, the encapsulation material containing ions which have a mobility that decreases as the encapsulation material cures.

FIG. 5 illustrates another embodiment of the conduit 400 in which at least one additional pair of electrodes 412, 414 is disposed outside the conduit 400. The embodiment shown in FIG. 5 is similar to the embodiment shown in FIG. 4.

Different, however, at least one additional pair of electrodes 412, 414 is provided with the opposite voltage polarity as the first pair of electrodes 402, 404. According to this embodiment, positive ions (+) contained in the MC encapsulation material carried by the conduit 400 are attracted to different sides of the conduit 400, as are negative ions (−) contained in the MC encapsulation material.

Figure 6:
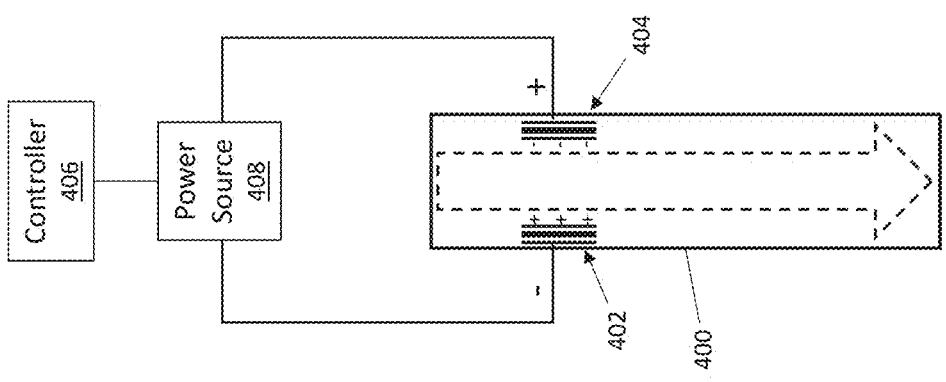

FIG. 6 illustrates an embodiment of the conduit 400 in which the at least one pair of electrodes 402, 404 is disposed inside the conduit 400. An electric field is applied to the MC encapsulation material carried by the conduit 400 via the at least one pair of electrodes 402, 404. A controller 406 may control a power source 408 so that a constant or changing electric field is applied to the MC encapsulation material via the at least one pair of electrodes 402, 404 disposed inside the conduit 400. Mobile ions contained in the MC encapsulation material move in response to the applied electric field. Positive ions (+) are attracted to each negatively charged electrode 402, and negative ions (−) are attracted to each positively charged electrode 404. The electric field applied to the at least one pair of electrodes 402, 404 disposed inside the conduit 400 holds (traps) the ions against the electrodes 402, 404 so that the amount of ions contained in the MC encapsulation material is reduced. The electrodes 402, 404 may be cleaned periodically, e.g. by flushing the conduit, to prevent ion buildup on the electrodes 402, 404.

Figure 7:
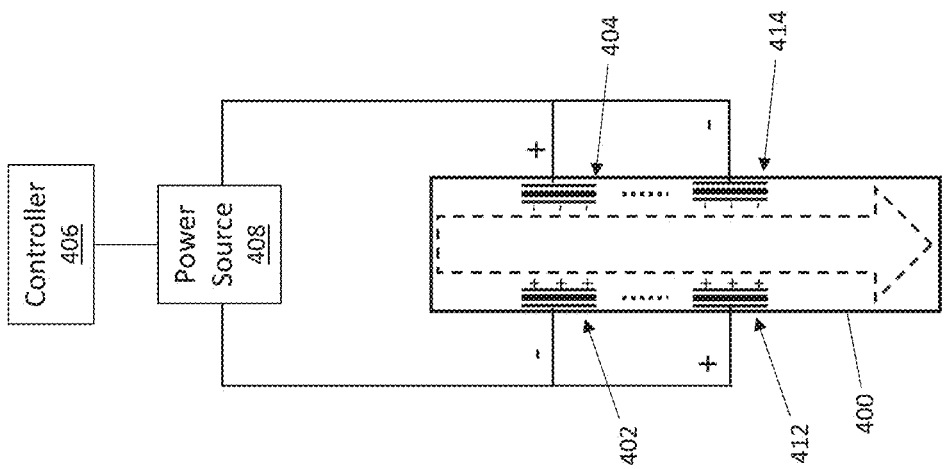

FIG. 7 illustrates another embodiment of the conduit 400 in which at least one additional pair of electrodes 412, 414 is disposed inside the conduit 400. The embodiment shown in FIG. 7 is similar to the embodiment shown in FIG. 6. Different, however, at least one additional pair of electrodes 412, 414 is provided with the opposite voltage polarity as the first pair of electrodes 402, 404. According to this embodiment, positive ions (+) contained in the MC encapsulation material carried by the conduit 400 are attracted to electrodes 402, 414 on different sides of the conduit 400, as are negative ions (−) contained in the MC encapsulation material.

Figure 8:
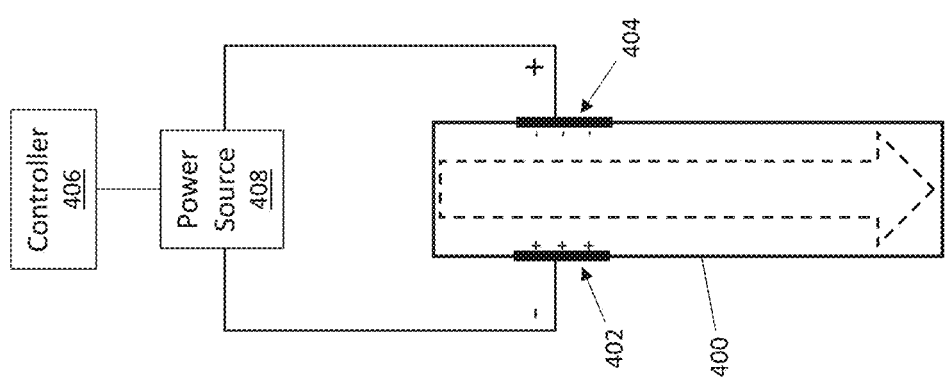

FIG. 8 illustrates an embodiment of the conduit 800 in which the at least one pair of electrodes 402, 404 form part of the conduit 400. For example, the at least one pair of electrodes 402, 404 may be integrated into the wall structure of the conduit 400. In another example, the walls of the conduit 400 or regions of the walls may be electrically segmented to form the at least one pair of electrodes 402, 404. In either case, an electric field is applied to the MC encapsulation material carried by the conduit 400 via the at least one pair of electrodes 402, 404 which form part of the conduit 400. A controller 406 may control a power source 408 so that a constant or changing electric field is applied to the MC encapsulation material via the at least one pair of electrodes 402, 404. Mobile ions contained in the MC encapsulation material move in response to the applied electric field. Positive ions (+) are attracted to each negatively charged electrode 402, and negative ions (−) are attracted to each positively charged electrode 404. In FIG. 8, the electric field applied to the at least one pair of electrodes 402, 404 which form part of the conduit 400 holds (traps) the ions against the part of the conduit walls with the integrated electrodes 402, 404 so that the amount of ions contained in the MC encapsulation material is reduced. The inner walls of the conduit 400 may be cleaned periodically, e.g. by flushing the conduit, to prevent ion buildup on the inner walls.

Figure 9:
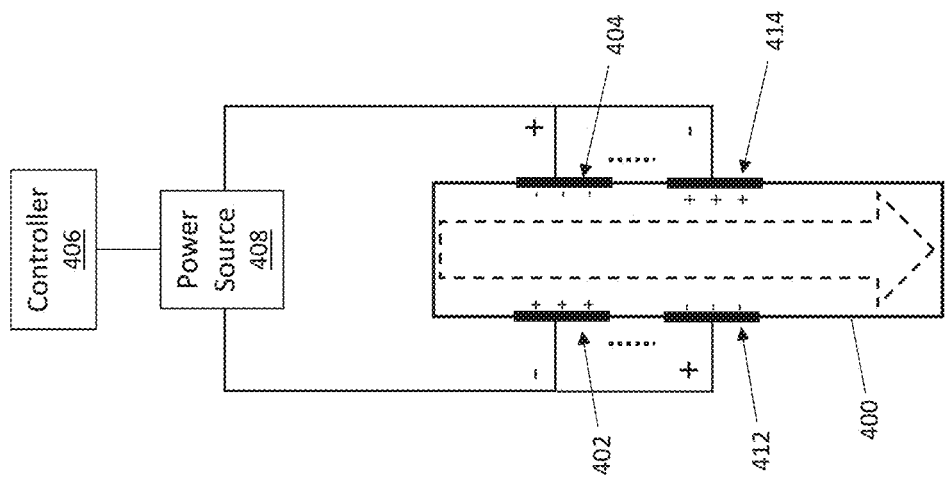

FIG. 9 illustrates another embodiment of the conduit 400 in which at least one additional pair of electrodes 412, 414 form part of the conduit 400. The embodiment shown in FIG. 9 is similar to the embodiment shown in FIG. 8. Different, however, at least one additional pair of electrodes 412, 414 integrated into the wall structure of the conduit 400 is provided with the opposite voltage polarity as the first pair of integrated electrodes 402, 404. According to this embodiment, positive ions (+) contained in the MC encapsulation material carried by the conduit 400 are attracted to electrodes 402, 424 integrated in different sides of the conduit 400, as are negative ions (−) contained in the MC encapsulation material.

Figure 10A:
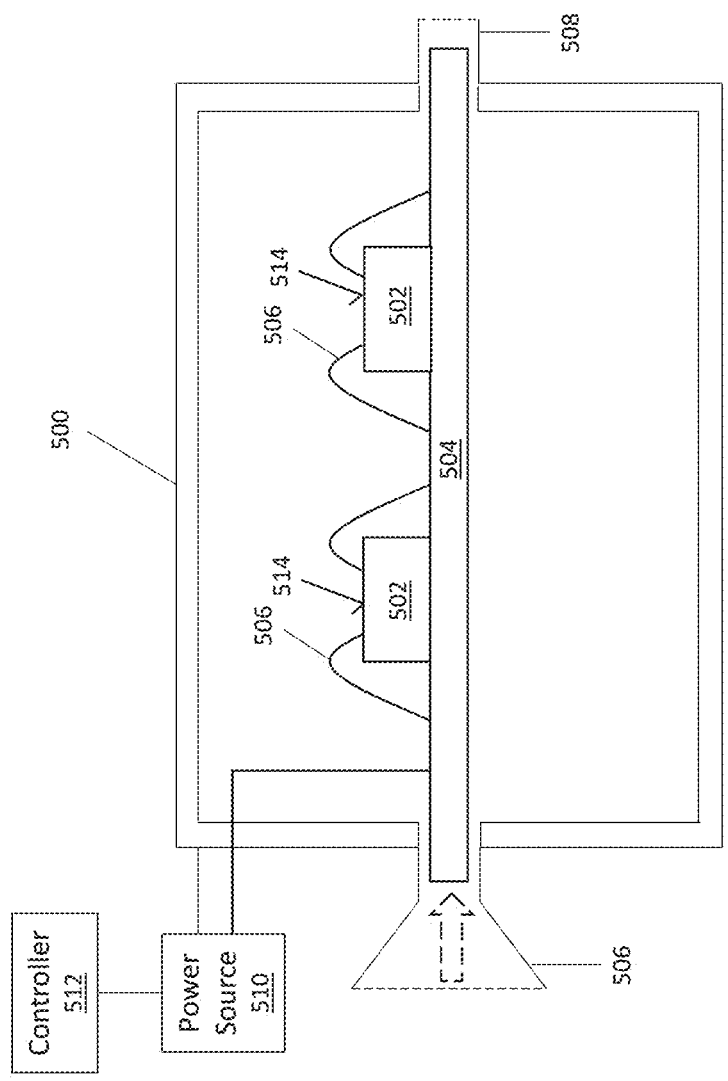
FIG. 10A illustrates a schematic diagram of an embodiment of a system configured to implement the ion manipulation method illustrated in FIG. 1 in a mold cavity enclosure configured to receive a melted or liquified mold compound encapsulation material containing ions which have a mobility that decreases as the encapsulation material cures.

FIG. 10A illustrates an embodiment in which the ion manipulation method described herein is used with an enclosure configured to receive an encapsulation material for a semiconductor device, the encapsulation material containing ions which have a mobility that decreases as the encapsulation material cures. According to the embodiment shown in FIG. 10A, the enclosure is a mold cavity 502 configured to receive a melted or liquified MC encapsulation material containing ions which have a mobility that decreases as the encapsulation material cures, and one or more semiconductor devices 502 to be at least partly covered by the MC encapsulation material. The MC encapsulation material is indicated by a rightward-facing dashed arrow in FIG. 10A.

Each semiconductor device 502 has terminals electrically connected to a substrate 504 such as a lead frame, PCB, ceramic substrate with a metallized side, etc. The electrical connections 506 are shown as bond wire connections in FIG. 10A merely for ease of illustration, however, other types of electrical connections may be used such as metal clips, ribbons, solder bumps, etc. The semiconductor devices 502 may be any type of semiconductor die (chip) or package that is to be at least partly covered by the encapsulation material. For example, each semiconductor device 502 may be a passive device such as an inductor, resistor and/or capacitor, or an active device such as a power device like a power transistor, power diode, etc., a logic device like a controller, ASIC (application-specific integrated-circuits), etc., a memory device, a sensor, a MEMS (microelectromechanical systems), etc.

Regardless of the type and quantity of semiconductor devices 502, the mold cavity 500 includes an input 506 for receiving the liquified MC encapsulation material as it flows through a conduit (not shown) and into the mold cavity 500. The mold cavity 500 may also include a vent 508.

An electric field may be applied to the MC encapsulation material inside the mold cavity 500 by a power source 510 controlled by a controller 512. The controller 512 and power source 510 may be integrated or separate components. The controller 512 may control the power source 408 so that a constant electric field is applied to the MC encapsulation material inside the mold cavity 500. In another embodiment, the controller 512 may control the power source 510 so that a changing electric field is applied to the MC encapsulation material inside the mold cavity 500. In either case, the ions contained in the MC encapsulation material are mobile enough to be moved by the applied electric field.

The electric field may be generated by applying a voltage across a first electrode provided by the semiconductor device(s) 502 included in the mold cavity 500 and a second electrode spaced apart from the semiconductor device(s) 502 in the mold cavity 500. One terminal of the power source may be electrically connected to the substrate 504 to which the semiconductor device(s) 502 are attached. In some cases, all terminals of each semiconductor device 502 may be shorted via the substrate 504 until after final curing, so no large voltages buildup within the device(s) 502 in response to the applied electric field. If the terminals of each semiconductor device 502 are not shorted together via the substrate 504 during the encapsulation process, additional care should be taken to ensure problematic voltages do not buildup within the device(s) 502 in response to the applied electric field. In either case, the semiconductor device(s) 502 included in the mold cavity 500 may form one electrode for applying the electric field to the MC encapsulation material.

In one embodiment, the mold cavity 500 or part of the mold cavity 500 is electrically conductive and forms the second electrode for applying the electric field to the encapsulation material. Since ions are still mobile at this point in the manufacturing process, the electric field applied via the electrodes in the mold cavity 500 concentrates the mobile ions contained in the MC encapsulation material in one or more regions of the MC encapsulation material which have less effect on electrical parameters and functionality of the semiconductor device(s) 502. The mobile ions contained in the MC encapsulation material may be concentrated in one or more regions of the MC encapsulation material spaced apart from the surface 512 of the semiconductor device(s) 502 in contact with the MC encapsulation material.

Figure 10B:
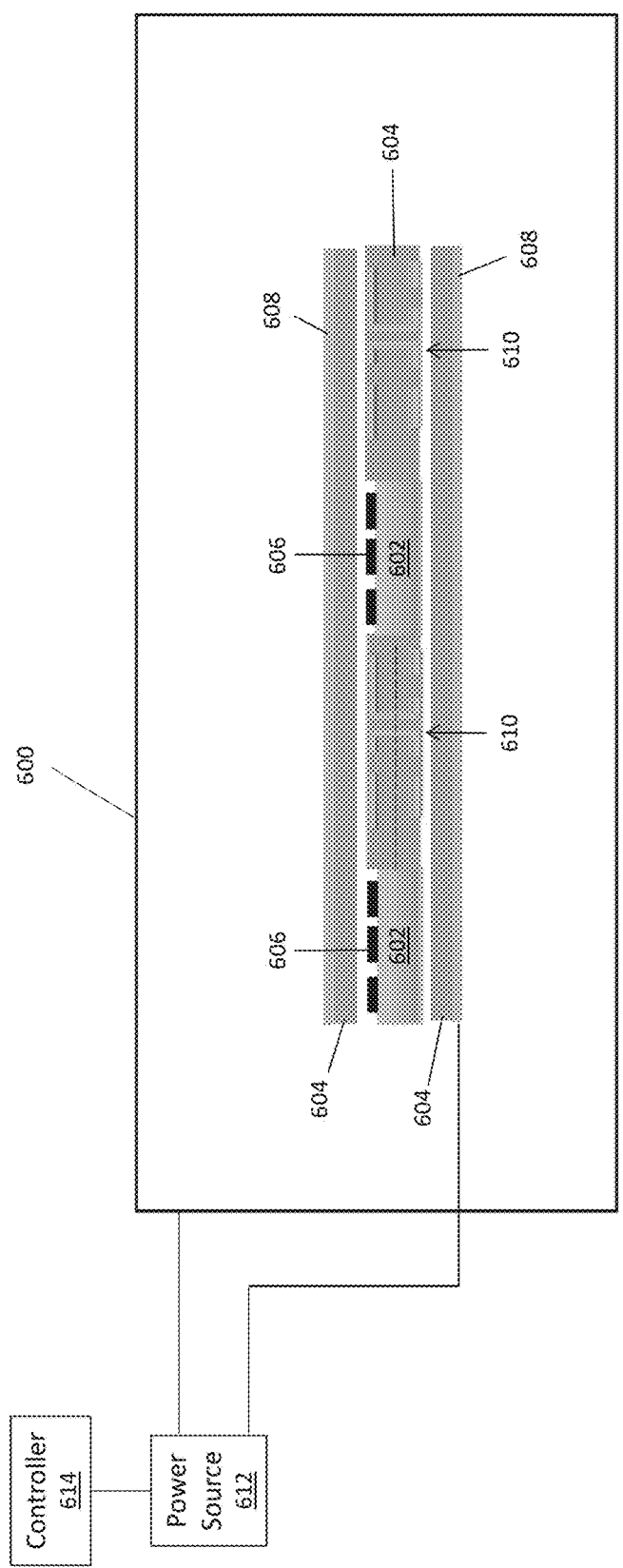
FIG. 10B illustrates a schematic diagram of an embodiment of a system configured to implement the ion manipulation method illustrated in FIG. 1 in a chamber configured to receive a PCB or eWLB encapsulation material containing ions which have a mobility that decreases as the encapsulation material cures.

FIG. 10B illustrates an embodiment in which the enclosure is a chamber 600 configured to receive a PCB or eWLB encapsulation material containing ions which have a mobility that decreases as the encapsulation material cures, and one or more semiconductor devices 602 to be at least partly covered by the encapsulation material. For example, each semiconductor device 602 may be placed between sheets of PCB or eWLB laminate layers 604. Each semiconductor device 602 has terminals 606 electrically connected by conductive traces 608 and/or vias 610 extending through and/or formed on surfaces of the PCB/eWLB encapsulation material 604. The semiconductor device(s) 602 may be any type of semiconductor die (chip) or package that is to be at least partly covered by the PCB/eWLB encapsulation material 604. For example, each semiconductor device 602 may be a passive device such as an inductor, resistor and/or capacitor, or an active device such as a power device like a power transistor, power diode, etc., a logic device like a controller, ASIC (application-specific integrated-circuits), etc., a memory device, a sensor, a MEMS (microelectromechanical systems), etc. Regardless of the type and quantity of semiconductor devices 502, the chamber 600 receives the semiconductor device(s) 602 and the PCB/eWLB encapsulation material 604.

An electric field may be applied to the PCB/eWLB encapsulation material 604 inside the chamber 600 by a power source 612 controlled by a controller 614. The controller 614 and power source 612 may be integrated or separate components. The controller 614 may control the power source 612 so that a constant electric field is applied to the PCB/eWLB encapsulation material 604 inside the chamber 600. In another embodiment, the controller 614 may control the power source 612 so that a changing electric field is applied to the PCB/eWLB encapsulation material 604 inside the chamber 600. In either case, the ions contained in the PCB/eWLB encapsulation material 604 are mobile enough to be moved by the applied electric field.

The electric field may be generated by applying a voltage across a first electrode provided by the semiconductor device(s) 602 included in the chamber 600 and a second electrode spaced apart from the semiconductor device(s) 602 in the chamber 600. One terminal of the power source 612 may be electrically connected to the semiconductor device (s) 602 e.g. through one or more of the conductive traces 608 and/or vias 610 extending through and/or formed on surfaces of the PCB/eWLB encapsulation material 604. In some cases, all terminals 606 of each semiconductor device 602 may be shorted so no large voltages buildup within each device 602 in response to the applied electric field. If the terminals 606 of a semiconductor device 602 are not shorted together during the encapsulation process, additional care should be taken to ensure problematic voltages do not buildup within that device 602 in response to the applied electric field. In either case, the semiconductor device(s) 602 included in the chamber 600 form one electrode for applying the electric field to the PCB/eWLB encapsulation material 604.

In one embodiment, the chamber 600 or part of the chamber 600 is electrically conductive and forms the second electrode for applying the electric field to the PCB/eWLB encapsulation material 604. Since ions are still mobile at this point in the manufacturing process, the electric field applied via the electrodes in the chamber 600 concentrates the mobile ions contained in the PCB/eWLB encapsulation material 604 in one or more regions of the PCB/eWLB encapsulation material 604 which have less effect on electrical parameters and functionality of the semiconductor device(s) 602. The mobile ions contained in the PCB/eWLB encapsulation material 604 may be concentrated in one or more regions of the PCB/eWLB encapsulation material 604 spaced apart from the surface of the semiconductor device(s) 502 in contact with the PCB/eWLB encapsulation material 604.

As described previously herein, the encapsulation material to which the ion manipulation method described herein is applied may be any standard encapsulation material for semiconductor devices and that contains ions which have a mobility that decreases as the encapsulation material cures. For example, the encapsulation material may be and standard insulative PCB material with or without glass fibers, polymer films or stacks of polymer films, any standard insulative eWLB material, etc. The type of enclosure in which a semiconductor device is at least covered by the encapsulation material depends on the type of encapsulation material used, and may be readily retrofit to accommodate the electrode configuration described above and shown in FIGS. 10A and 10B.

Standard mold cavities and PCB/eWLB processing chambers typically comprise metal components such as metal plates, platforms, etc., which may form the second electrode and the semiconductor devices may be readily contacted electrically to form the first electrode. In general, the second electrode may be an extra metallic electrode or may be realized by a conductive part which is already used e.g. as part of a molding chamber, curing oven, etc.

An electric field is applied to the encapsulation material contained in the enclosure via the electrodes. A controller may be provided for controlling a power source which applies a voltage across the electrodes. The controller may control the power source so that a constant electric field is applied to the encapsulation material via the electrodes. In another embodiment, the controller may control the power source so that a changing electric field is applied to the encapsulation material via the electrodes. In either case, ions contained in the encapsulation material are mobile enough to be moved by the applied electric field. Positive ions (+) contained in the encapsulation material are attracted to the negatively charged electrode, and negative ions (−) contained in the encapsulation material are attracted to the positively charged electrode.

Figure 11:
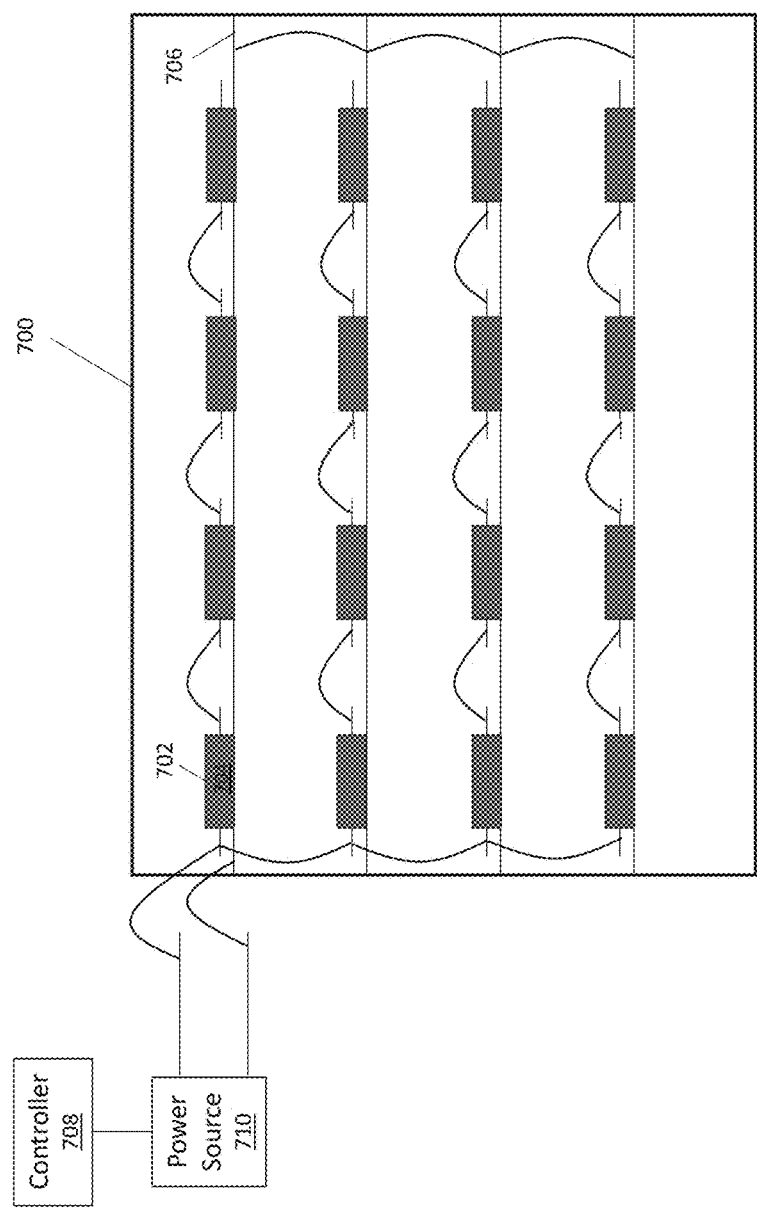
FIG. 11 illustrates a schematic diagram of an embodiment of a system configured to implement the ion manipulation method illustrated in FIG. 1 in a curing oven.

FIG. 11 illustrates an embodiment in which the ion manipulation method described herein is used with a curing oven 700 configured to cure an encapsulation material 702 of packaged semiconductor devices 704. The curing oven 700 may hold a plurality of packaged semiconductor devices 704. Each packaged semiconductor device 704 includes one or more semiconductor devices and/or dies (out of view) in contact with an encapsulation material 702. The encapsulation material 702 contains ions which remain mobile since the encapsulation material 702 has not yet been fully cured. By applying an electric field to the encapsulation material 702 before the encapsulation material 702 is finally cured, the ions contained in the encapsulation material 702 may be concentrated in one or more less critical regions of the encapsulation material 702 which have less effect on electrical parameters and functionality of the semiconductor devices in contact with the encapsulation material 702.

A first electrode for applying the electric field is provided by the packaged semiconductor devices 704, and a second electrode for applying the electric field is spaced apart from the packaged semiconductor devices 704 in the curing oven 700. In one embodiment, the curing oven 700 includes one or more racks 706 on which the packaged semiconductor devices 704 rest during final curing of the encapsulation material 702. In one embodiment, the racks 706 form the second electrode for applying the electric field and may be electrically connected together within the curing oven 700 e.g. via jumpers, cables, wires, etc. as shown in FIG. 11. The packaged semiconductor devices 704 may be electrically connected together within the curing oven 700 e.g. via jumpers, cables, wires, etc. also as shown in FIG. 11 to form the first electrode for applying the electric field. The wiring between the packaged semiconductor devices 704 can be just the natural connection within the same leadframe. In some cases, the packaged semiconductor devices 704 may not be used as an electrode and instead a separate pair of electrodes (plus and minus) is provided without contacting the devices 704.

An electric field is applied to the encapsulation material 702 of the packaged semiconductor devices 704 contained in the curing oven 700 via the electrodes. A controller 708 may be provided for controlling a power source 710 which applies a voltage across the electrodes. The controller 708 may control the power source 710 so that a constant electric field is applied to the encapsulation material 702 via the electrodes. In another embodiment, the controller 708 may control the power source 710 so that a changing electric field is applied to the encapsulation material 702 via the electrodes. In either case, ions contained in the encapsulation material 702 of each packaged semiconductor device 704 are mobile enough during the final curing process to be moved by the applied electric field. Positive ions (+) contained in the encapsulation material 702 are attracted to the negatively charged electrode, and negative ions (−) contained in the encapsulation material 702 are attracted to the positively charged electrode.

Figure 12:
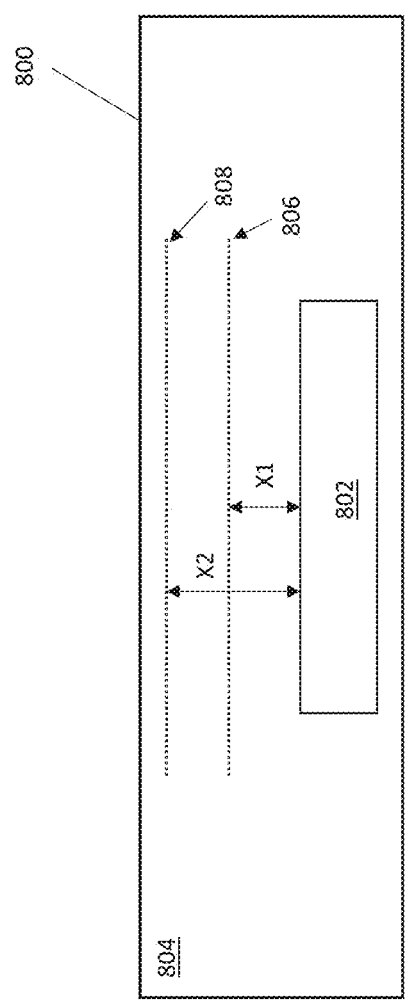
FIGS. 12 through 14 illustrate respective embodiments of a packaged semiconductor device processed with the ion manipulation method illustrated in FIG. 1.

FIG. 12 illustrates an embodiment of a packaged semiconductor device 800 processed with the ion manipulation method described herein at least during embedding and/or final curing. According to this embodiment, the packaged semiconductor device 800 includes a semiconductor die 802 and an encapsulation material 804 contacting the semiconductor die 802. The packaged semiconductor device 800 may include more than one semiconductor die 802. One semiconductor die 802 is shown in FIG. 12 merely for ease of illustration.

The ion manipulation method described herein results in a first group of ions 806 being concentrated in the encapsulation material 804 at a first distance X1 from the semiconductor die 802. A second group of ions 808 may be concentrated in the encapsulation material 804 at a second distance X2 from the semiconductor die 802 greater than the first distance X1. Additional groups of ions may be concentrated in the encapsulation material 802 at even further distances from the semiconductor die 802, but are not shown in FIG. 12 for ease of illustration. The distances X1, X2 may be selected so that each group of concentrated ions 806, 808 is disposed in a less critical region of the encapsulation material 804 which has less effect on electrical parameters and functionality of the semiconductor die 802 in contact with the encapsulation material 804.

Depending on the way in which the electric field is applied to the encapsulation material 804 during processing, different arrangements of positive (+) and negative (−) ion concentrations may be realized in the encapsulation material. Ion mobility changes (decreases) as the encapsulation material 804 cures. For example, ion mobility may be high initially and then decrease over time as the encapsulation material 804 hardens. Negative ions are larger and less mobile than positive ions. In one embodiment, a negative voltage may be applied to the encapsulation material 804 at the beginning of the ion manipulation method to force negative (bigger/slower) ions away from the die 802 when mobility is high. The voltage polarity may be later switched to positive, to force positive (smaller/faster) ions away from the die 802 when mobility decreases. The negative ions will still be attracted to the positive (device) potential, but far enough away from the die 802 and much less mobile at this point in the process and therefore should not migrate back to their original location. The positive ions are still mobile enough to move away from the die 802 even though their mobility has decreased. The switchover point from a negative device voltage to a positive device voltage may be determined by trial and error, and/or based on a mobility curve for the encapsulation material 804 which may be measured. In still other embodiments, a positive device voltage may be applied first and then a negative voltage.

Figure 13:
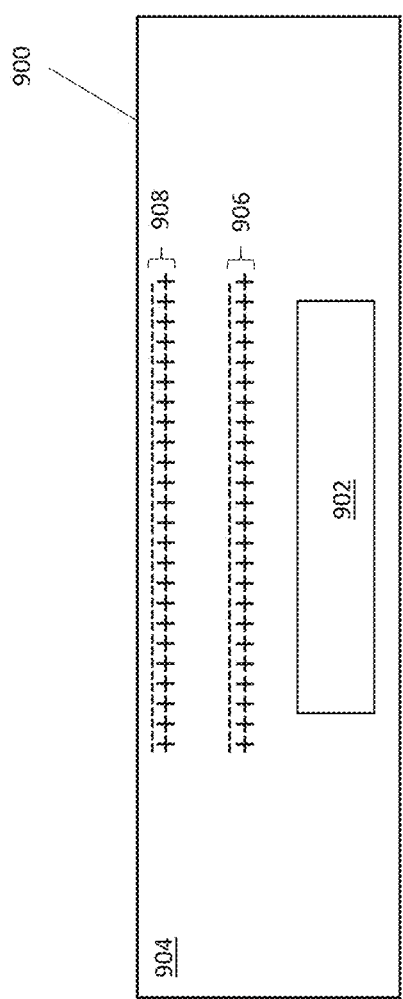

FIG. 13 illustrates an embodiment of a packaged semiconductor device 900 processed with the ion manipulation method implemented with a switchover point from a negative device voltage to a positive device voltage at least during device embedding and/or final curing. The packaged semiconductor device 900 includes a semiconductor die 902 and an encapsulation material 904 contacting the semiconductor die 902. The packaged semiconductor device 900 may include more than one semiconductor die 902. One semiconductor die 902 is shown in FIG. 13 merely for ease of illustration. A first group of ions 906 concentrated within the encapsulation material 904 includes a layer or distribution of positively-charged ions (+) offset from a layer or distribution of negatively-charged ions (−). A second group 908 of ions concentrated within the encapsulation material 904 similarly includes a layer or distribution of positively-charged ions (+) offset from a layer or distribution of negatively-charged ions (−).

Figure 14:
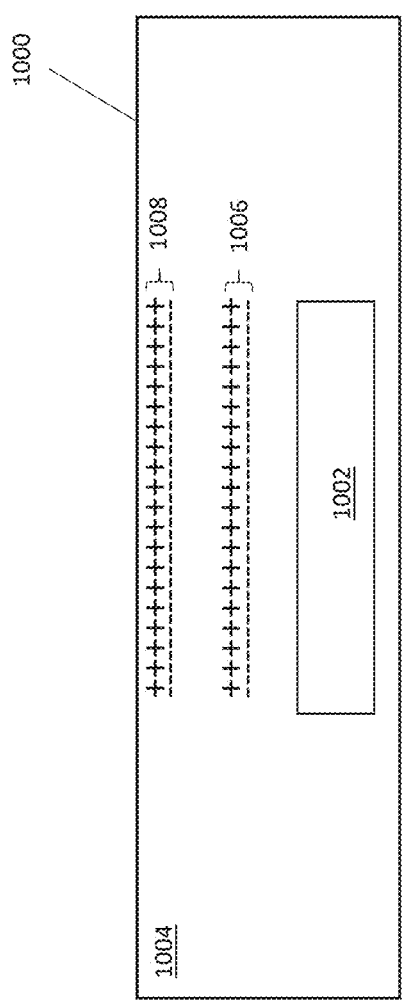

FIG. 14 illustrates an embodiment of a packaged semiconductor device 1000 processed with the ion manipulation method implemented with a switchover point from a positive device voltage to a negative device voltage at least during device embedding and/or final curing. The packaged semiconductor device 1000 includes a semiconductor die 1002 and an encapsulation material 1004 contacting the semiconductor die 1002. The packaged semiconductor device 1000 may include more than one semiconductor die 1002. One semiconductor die 1002 is shown in FIG. 14 merely for ease of illustration.

The embodiment shown in FIG. 14 is similar to the embodiment shown in FIG. 13. Different, however, the layer or distribution of negatively-charged ions (−) for each group 1006, 1008 of ions concentrated within the encapsulation material 904 is spaced closer to the semiconductor die 1002 than the corresponding layer or distribution of positively-charged ions (+). Still other ion concentration profiles are contemplated. For example, one group of concentrated ions within the encapsulation material 1004 may have a layer or distribution of positively-charged ions (+) stacked over a layer or distribution of negatively-charged ions (−), and another group of concentrated ions within the encapsulation material 1004 may have a layer or distribution of negatively-charged ions (−) stacked over a layer or distribution of positively-charged ions (+). Different ions with different motilities may be present, e.g., more than one kind of ion or the same atom/molecule with different charged states. In general, the number and orientation of each group of concentrated ions included in the encapsulation material 1004 depends on the number and type (+ to − or − to +) of voltage polarity switchover points performed during each instance of the ion manipulation method.

Figure 15A:
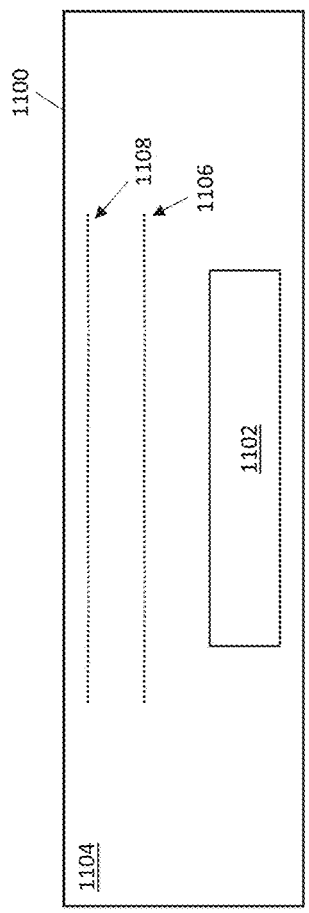
FIGS. 15A through 15C illustrate an embodiment of removing one or more groups of concentrated ions within the encapsulation material of a packaged semiconductor device processed with the ion manipulation method illustrated in FIG. 1.
Figure 15B:
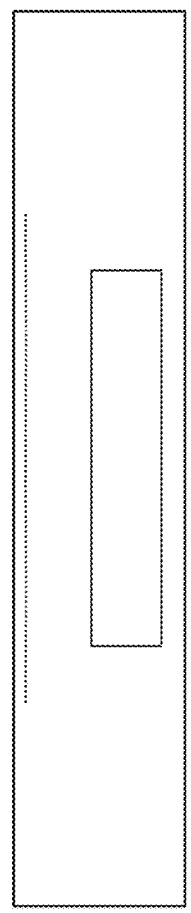
Figure 15C:

FIGS. 15A through 15C illustrate an embodiment of removing one or more groups of concentrated ions within the encapsulation material of a packaged semiconductor device. Each group of concentrated ions is produced using the ion manipulation method described herein. The packaged semiconductor device 1100 includes a semiconductor die 1102 and an encapsulation material 1104 contacting the semiconductor die 1102. The packaged semiconductor device 1100 may include more than one semiconductor die 1102. One semiconductor die 1102 is shown in FIGS. 15A through 15C merely for ease of illustration.

FIG. 15A shows the packaged semiconductor device 1100 with two groups of concentrated ions 1106, 1108 within the encapsulation material 1104. In general, the ion manipulation method described herein may produce more or less groups of concentrated ions within the encapsulation material 1104, the number and (+/−) orientation of which depends on the voltage polarity and number of voltage polarity switchover points performed during each instance of the ion manipulation method.

FIG. 15B shows the packaged semiconductor device 1100 after the uppermost group 1108 of concentrated ions within the encapsulation material 1104 is removed by thinning the encapsulation material 1104 e.g. by etching, grinding, leaching, etc. Alternatively, the encapsulation material 1104 may be selectively etched to remove ions just a critical ion species without having to thin the entire device. In yet another embodiment, a specific chemical reaction may be applied to the encapsulation material 1104 to remove ions rigidly bound to the outer region of the encapsulation material 1104.

FIG. 15C shows the packaged semiconductor device 1100 after all groups 1106, 1108 of concentrated ions within the encapsulation material 1104 are removed by thinning the encapsulation material 1104 e.g. by etching, grinding, leaching, etc. Hence, the final packaged semiconductor device 1100 may include zero, one or a plurality of groups of concentrated ions within the encapsulation material 1104 of the packaged semiconductor device 1100. Each group of concentrated ions included within the encapsulation material 1104 of the final packaged semiconductor device 1100 may have a layer or distribution of positively (+) or negatively (−) charged ions stacked over a layer or distribution of the opposite ion type. Each group of ions may be concentrated in a less critical region of the encapsulation material 1104 which has less effect on electrical parameters and functionality of the semiconductor die 1102 in contact with the encapsulation material 1104.

Figure 16:
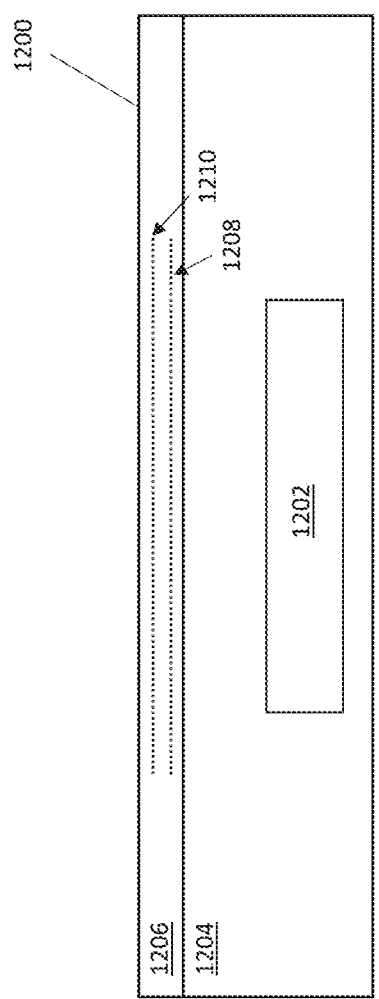
FIG. 16 illustrates an embodiment of a packaged semiconductor device processed with the ion manipulation method illustrated in FIG. 1, and which includes a gettering structure for gettering (trapping) the ions moved away from the surface of the semiconductor device by the ion manipulation method.

FIG. 16 illustrates an embodiment of a packaged semiconductor device 1200 processed with the ion manipulation method described herein. The packaged semiconductor device 1200 includes a semiconductor die 1202 and an encapsulation material 1204 contacting the semiconductor die 1202. The packaged semiconductor device 1200 may include more than one semiconductor die 1202. One semiconductor die 1202 is shown in FIG. 16 merely for ease of illustration.

The packaged semiconductor device 1200 also includes a gettering structure 1206 such as a layer added to the encapsulation material 1204, a surface structure of the encapsulation material 1204 with increased roughness, a treated surface of the encapsulation material 1204, etc. The gettering structure 1206 getters or traps concentrations of ions 1208, 1210 moved away from the surface of the semiconductor die 1202 by the ion manipulation method. The gettering structure 11206 prevents or at least reduces migration of the concentrations of ions 1208, 1210 after final curing of the encapsulation material 1204. Additionally or alternatively, ionic contamination within the encapsulation material 1204 may be further mitigated by cleaning, etching, leaching, etc. of the encapsulation material 1204.

Spatially relative terms such as "under", "below", "lower", "over", "upper" and the like, are used for ease of description to explain the positioning of one element relative to a second element. These terms are intended to encompass different orientations, including different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method, comprising:
  processing an encapsulation material for a semiconductor device, the encapsulation material containing ions which have a mobility that decreases as the encapsulation material cures; and
  applying an electric field to the encapsulation material before the encapsulation material is finally cured, to reduce the amount of ions contained in the encapsulation material and/or to concentrate the ions contained in the encapsulation material in one or more regions of the encapsulation material.

2. The method of claim 1, wherein applying the electric field to the encapsulation material before the encapsulation material is finally cured comprises applying a voltage across at least one pair of electrodes in close proximity to the encapsulation material so that positive ions contained in the encapsulation material are attracted to each negatively charged electrode of the at least one pair of electrodes and negative ions contained in the encapsulation material are attracted to each positively charged electrode of the at least one pair of electrodes.

3. The method of claim 2, wherein the at least one pair of electrodes is in direct contact with the encapsulation material.

4. The method of claim 1, wherein the electric field applied to the encapsulation material is constant.

5. The method of claim 1, further comprising:
changing the electric field applied to the encapsulation material.

6. The method of claim 1, wherein processing the encapsulation material comprises forcing a liquified base material used to form the encapsulation material through a conduit, and wherein applying the electric field to the encapsulation material before the encapsulation material is finally cured comprises applying a voltage across at least one pair of electrodes disposed outside the conduit, disposed inside the conduit or which form part of the conduit.

7. The method of claim 1, wherein processing the encapsulation material comprises forcing the encapsulation material in an uncured state through a conduit, and wherein applying the electric field to the encapsulation material before the encapsulation material is finally cured comprises applying a voltage across at least one pair of electrodes disposed outside the conduit, disposed inside the conduit or which form part of the conduit.

8. The method of claim 1, wherein processing the encapsulation material comprises inserting the encapsulation material in a chamber or mold cavity that holds the semiconductor device, and wherein applying the electric field to the encapsulation material before the encapsulation material is finally cured comprises applying a voltage across a first electrode provided by the semiconductor device and a second electrode spaced apart from the semiconductor device in the chamber or mold cavity.

9. The method of claim 1, wherein processing the encapsulation material comprises curing the encapsulation material in a curing oven after the encapsulation material is applied to the semiconductor device, and wherein applying the electric field to the encapsulation material before the encapsulation material is finally cured comprises applying a voltage across a first electrode provided by the semiconductor device and a second electrode spaced apart from the semiconductor device in the curing oven.

10. The method of claim 9, further comprising one of:
thinning the encapsulation material after being cured in the curing oven;
selectively etching the encapsulation material after being cured in the curing oven; and
applying a specific chemical reaction to the encapsulation material after being cured in the curing oven.

11. A semiconductor device, comprising:
a semiconductor die;
an encapsulation material contacting the semiconductor die; and
a first group of ions concentrated in the encapsulation material at a first distance from the semiconductor die,
wherein the first group of ions comprises a first distribution of positively-charged ions offset from a first distribution of negatively-charged ions.

12. The semiconductor die of claim 11, further comprising a second group of ions concentrated in the encapsulation material at a second distance from the semiconductor die greater than the first distance.

13. The semiconductor die of claim 12, wherein the second group of ions comprises a second distribution of positively-charged ions offset from a second distribution of negatively-charged ions.

14. An apparatus, comprising:
an enclosure configured to receive an encapsulation material for a semiconductor device, the encapsulation material containing ions which have a mobility that decreases as the encapsulation material cures;
at least one pair of electrodes configured to apply an electric field to the encapsulation material received by the enclosure before the encapsulation material is finally cured, to reduce the amount of ions contained in the encapsulation material and/or to concentrate the ions contained in the encapsulation material in one or more regions of the encapsulation material; and
a power source configured to provide a voltage across the at least one pair of electrodes.

15. The apparatus of claim 14, wherein the enclosure is a conduit configured to carry a liquified base material used to form the encapsulation material or to carry the encapsulation material in an uncured state to a chamber or mold cavity, and wherein the at least one pair of electrodes is disposed outside the conduit, disposed inside the conduit or form part of the conduit.

16. The apparatus of claim 14, wherein the enclosure is a chamber or mold cavity configured to receive the semiconductor device and the encapsulation material, and wherein the at least one pair of electrodes comprises a first electrode provided by the semiconductor device and a second electrode spaced apart from the semiconductor device in the chamber or mold cavity.

17. The apparatus of claim 16, wherein the chamber or mold cavity forms the second electrode.

18. The apparatus of claim 14, wherein the enclosure is a curing oven configured to cure the encapsulation material after the encapsulation material is applied to the semiconductor device, and wherein the at least one pair of electrodes comprises a first electrode provided by the semiconductor device and a second electrode spaced apart from the semiconductor device in the curing oven.

19. The apparatus of claim 18, wherein the curing oven comprises a rack on which the semiconductor device rests during curing of the encapsulation material, and wherein the rack forms the second electrode.

* * * * *